United States Patent [19]

Salcedo et al.

[11] Patent Number: 4,891,813
[45] Date of Patent: Jan. 2, 1990

[54] PASSIVE BUS COMMUNICATION USING ALTERNATE CRC

[75] Inventors: Rafael E. Salcedo, Miami Springs; Norman J. Donaghue, Jr., Plantation, both of Fla.

[73] Assignee: Racal Data Communications Inc., Sunrise, Fla.

[21] Appl. No.: 150,129

[22] Filed: Jan. 29, 1988

[51] Int. Cl.$^4$ ............................................. G06F 11/10
[52] U.S. Cl. .................................. 371/37.1; 370/110.1
[58] Field of Search ................... 371/37, 22, 3, 48, 30; 364/200 MS File, 900 MS File; 370/13, 14, 85, 60, 58, 110.1

[56] References Cited

U.S. PATENT DOCUMENTS

| | | | |
|---|---|---|---|
| 3,693,155 | 9/1972 | Crafton | 340/825.02 |
| 4,494,717 | 1/1985 | Corrie | 371/3 X |
| 4,581,733 | 4/1986 | Sarson | 370/85 X |
| 4,605,826 | 8/1986 | Kanemasa | 370/32.1 |
| 4,722,082 | 1/1988 | Furuya | 370/85 |
| 4,727,495 | 2/1988 | Cheetham | 370/112 X |
| 4,730,313 | 3/1988 | Stephenson | 371/15 X |
| 4,766,594 | 8/1988 | Ogawa | 371/22 |

FOREIGN PATENT DOCUMENTS 0151433 1/1985 European Pat. Off. .

OTHER PUBLICATIONS

"Computer Networks", Andrew S. Tanenbaum, Prentice-Hall Software Series, pp. 128–132, 1981.
"Considerations on Customer Access to the ISDN", IEEE Trans. on Comm. vol. COM-30, No. 9, Sep. 1982, (Waber), pp. 2131–2136.
"D-Channel Protocol: Role, Requirements, Level 2, Implications", Parodi, Romagnoli and Preti, 1982 IEEE, pp. 757–761.
"Integrated Digital Access Design for ISDN", Fung, Patel and Roddick, 1983 IEEE, pp. 1389–1395.
"ISDN Customer to Network Signalling D Channel Protocol Level 1 Aspects", Moore, Whall and Kerswell, 1982 IEEE, pp. 750–756.
"Phase Aligned Passive Bus (PAB) Scheme for ISDN User-Network Interface", Kuwahara, Amemiya and Murano, 1986 IEEE, pp. 1367–1372.
"Report: A Network Interface Chip for ISDN Terminals", Govind Offord and Piper, AT&T Technical Journal, 27–39, 3/1987.

*Primary Examiner*—Jerry Smith
*Assistant Examiner*—Robert W. Beausoliel
*Attorney, Agent, or Firm*—Jerry A. Miller

[57] ABSTRACT

An apparatus for providing passive bus communication in an ISDN without use of services of a central office uses an alternative error checking (CRC) technique for communication between devices on the passive bus. This alternate CRC is interpreted as an error at the central office so that local frames are discarded by the central office.

26 Claims, 3 Drawing Sheets

PASSIVE BUS COMMUNICATION USING ALTERNATE CRC

BACKGROUND

1. Field of the Invention

This invention relates generally to the field of Integrated Services Digital Networks (ISDN) and more particularly to a method and apparatus for implementing communication between devices coupled to an ISDN passive bus without intervention of a central office.

2. Background of the Invention

The evolving ISDN standard proposes use of a passive bus for local connection of a plurality (8) of terminal equipment (TE) devices. These devices are coupled to the ISDN network via a common network terminating device (NT). In the event a D-channel communication path is to be created between devices on the same passive bus, the originating device sends a packet to the central office to set up the call. The central office then sets up a logical channel between the devices to be connected. In this process, the telephone carrier operating the central office becomes involved in the communication process and may therefore charge a fee to the customer for implementing a logical connection between devices on the same passive bus.

The present invention allows users of this device to avoid such fees by implementing a logical channel independent of the central office. In addition, those skilled in the art will recognize further services that can be provided without intervention of the central office by use of the present invention.

In addition, it is often desirable to provide related and coordinated services between two TE devices on the same passive bus such as a personal computer and a telephone. For example, when a sales person receives a telephone call from a client, it would be advantageous for the identity of the caller to be detected by the computer and used to enter a data base which immediately displays customer information to the sales person. Other services dependent upon interaction between TE devices are also advantageously implemented with the present invention as will be clear to those skilled in the art.

In European Patent Application Ser. No. 151,433, passive bus communication in an ISDN is accomplished by having a network termination unit implement the connections. No particular method or apparatus for implementing passive bus connections is believed to be disclosed in this application.

SUMMARY OF THE INVENTION

It is an object of the present invention to provide a method and apparatus for communication between TE devices on an ISDN passive bus within the current standards constraints for ISDN.

It is another object of the present invention to provide a method and apparatus for communication between TE devices on an ISDN passive bus without central office intervention.

It is a further object of the present invention to provide such passive bus communication in a virtually transparent manner.

These and other objects of the invention will become apparent to those skilled in the art upon consideration of the following description of the invention.

In one embodiment of the present invention, an apparatus for providing communication over a passive bus in an ISDN without use of services of a central office, the ISDN using a predefined error checking operation at the central office, includes an echo receiving device, coupled to the passive bus, for receiving D-echo channel frames which are transmitted from a device connected to the passive bus and echoed by a network termination device. An alternate error checker, coupled to the receiving device, performs an error checking operation on the D-echo channel frames, the error checking operation being different from the predefined error checking operation used at the central office. In the preferred embodiment, the error checker performs a CRC check.

In a method according to the present invention for providing communication over a passive bus in an ISDN without use of services of a central office, the ISDN using a predefined error checking operation at the central office, the method includes the steps of receiving D-echo channel frames which are transmitted from a device connected to the passive bus and echoed by a network termination device; and performing an error checking operation on the D-echo channel frames, the error checking operation being different from the predefined error checking operation used at the central office. The error checking operation preferably includes performing a CRC check.

Another method for providing communication between two devices coupled to a common passive bus of an ISDN without intervention by a central office, comprises the steps of determining that information is to be transmitted to a local device on the passive bus; generating a D-channel frame which contains an apparent error when viewed by the central office; and transmitting the D-channel frame over the passive bus.

Another method of transmitting messages over a passive bus from one TE device to another TE device without central office intervention, comprises the steps of determining that a frame of information is to be destined for a TE device situated on the same passive bus as a TE device which is to transmit; and introducing an alteration to the frame of information in relation to what a standard ISDN frame of information would normally be so that the central office will interpret the frame as containing an error and discard the frame.

Another method for providing communication between two devices coupled to a common passive bus of an ISDN without intervention by a central office, includes the steps of determining that information is to be transmitted to a local device on the passive bus; generating a D-channel frame containing at least a portion of the information and which results in no operation by the central office; and transmitting said D-channel frame over the passive bus.

The features of the invention believed to be novel are set forth with particularity in the appended claims. The invention itself however, both as to organization and method of operation, together with further objects and advantages thereof, may be best understood by reference to the following description taken in conjunction with the accompanying drawing.

DETAILED DESCRIPTION OF THE INVENTION

The term "local" as used herein relates to communication between devices connected to the passive bus. The terms "normal" and "standard" relate to operations which follow the conventional operation of the particular ISDN of interest, i.e. outside the realm of the present invention. A "standard ISDN CRC process", for example, is the CRC process which is used in communication with the Central Office. An "alternative CRC process" is a process other than the standard ISDN CRC process.

Figure 1:
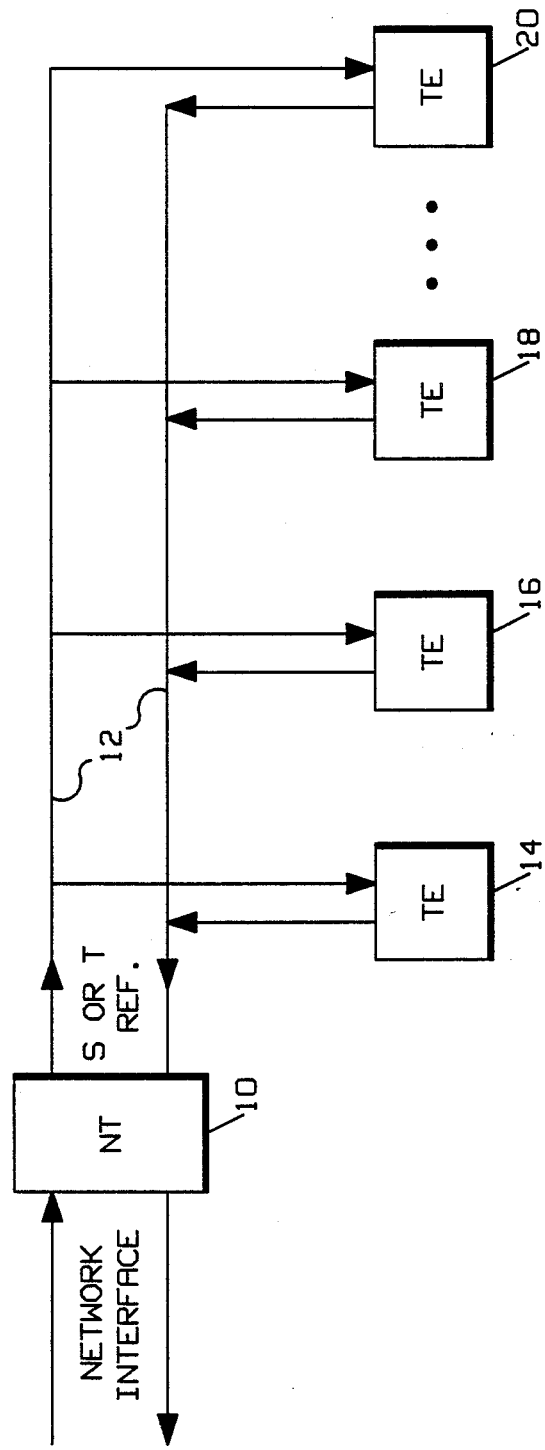
FIG. 1 is a system block diagram of a local passive bus coupled to an ISDN network.

Turning now to FIG. 1, the local portion of an ISDN is shown including a network termination device (NT) 10 which has the ISDN network interface at one side (the U reference point) which is ultimately connected to a central office providing access to the ISDN. At the other side is an S/T reference point. This S/T reference point forms the passive bus 12. A plurality of terminal equipment devices (TE) 14, 16, 18 through 20 are connected to the passive bus in parallel as shown.

Broadly speaking, local passive bus communication links are established by having the NT echo all D-channel activity over the D-echo channel on the passive bus in its normal manner and having the TE's monitor this channel for purposes other than simply resolving contention. In order to eliminate central office involvement in the process, an error is introduced into the D-channel frame so that during the normal operation procedure of the central office, the frame is discarded. This may be actually implemented in several ways as will be described. The present invention is implemented within TE devices which are coupled to the passive bus 12.

The SAPI (Service Access Point Identifier) in an ISDN is an address which identifies a point at which data link layer services are provided by a data link layer entity to a layer 3 or management entity. Consequently, the SAPI specifies a data link layer entity that should process a data link layer frame and also a layer 3 or management entity which is to receive information carried by the data link layer frame. The standard SAPI allows 64 service access points to be specified. In order to provide an address mechanism for communication over the passive bus, a Local SAPI is defined which is indicative of a local destination for the D-echo channel information according to the preferred embodiment of present invention. Such local communication will be specially processed by the TE as will be described. References to a SAPI made herein are understood to mean an ISDN SAPI.

Figure 2:
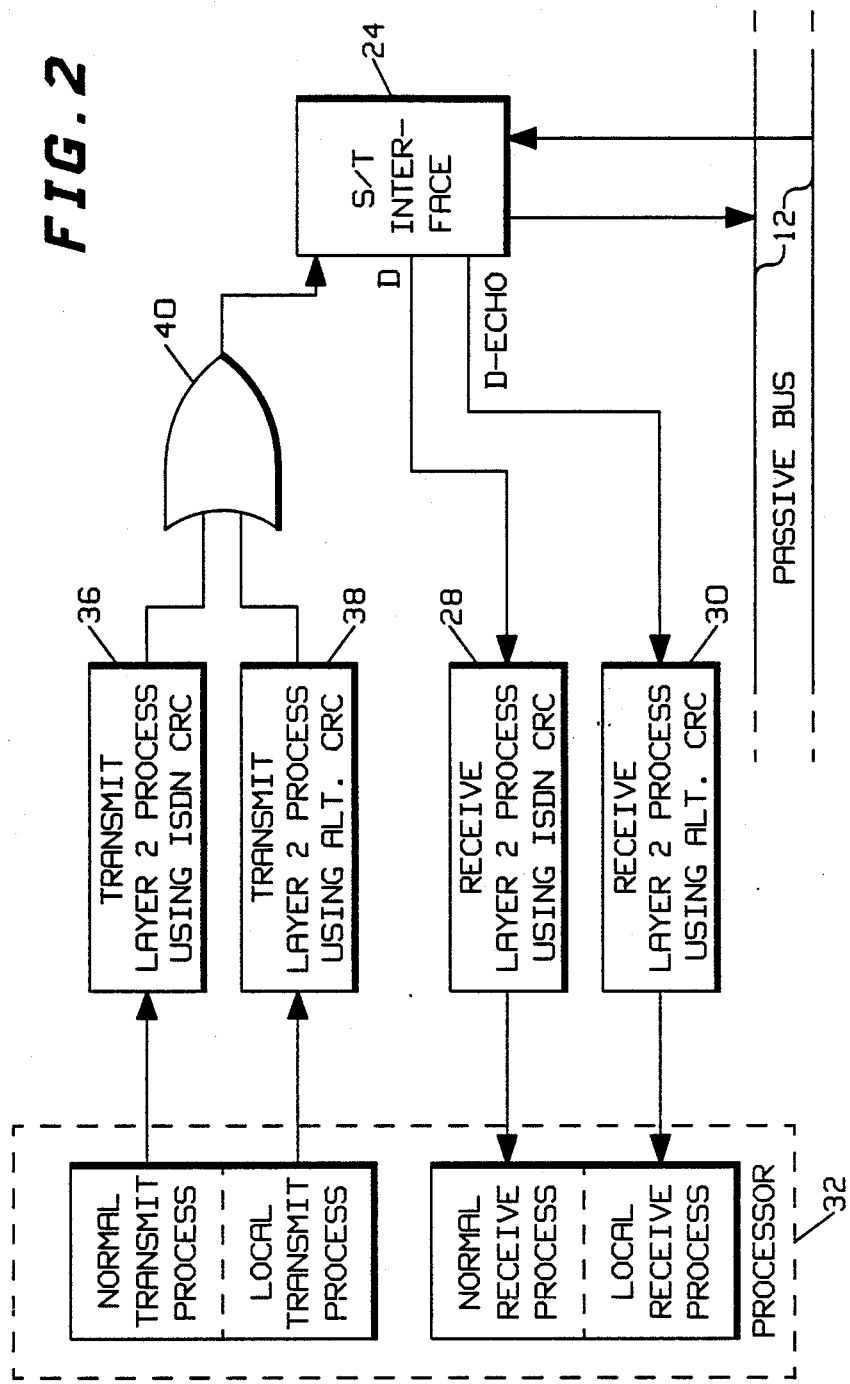
FIG. 2 is a functional block diagram of a terminal device (TE) including the present invention.

Turning now to FIG. 2, a block diagram of a TE such as an ISDN terminal adaptor is shown in which passive bus 12 is coupled to an S/T interface 24. A D-channel output is coupled to a receive layer 2 process 28. This receive layer 2 process performs framing, formatting, error checking (CRC) and related functions. In the case of process 28, the CRC error checking is done using the standard ISDN CRC process. The S/T interface 24 also provides the D-echo channel to receive layer 2 process 30 which performs similar types of functions as those of process 28 except that in the preferred embodiment an alternative CRC process is used. The output of processes 28 and 30 are passed to a processor 32 which performs a normal receive process and a local receive process respectively.

In the transmit direction, a normal process in processor 32 is delivered to a transmit layer 2 process 36 while local transmit process outputs are directed to a transmit layer 2 process 38. The process 36 uses standard ISDN CRC while the process 38 uses an alternate CRC process. The output of these processes 36 and 38 are ORed at OR gate 40 so that which ever process is in operation is passed to the S/T interface 24 and in turn to the passive bus 12.

In the preferred embodiment, different CRC processes are used for local transmissions than those of normal transmissions which may use central office services. By so doing, local D-channel frames which use the alternate CRC process will be interpreted as an error by the central office and discarded. For this to be assured, a different CRC process which always results in a different CRC than that which would normally be used by the system is generated by 38 and interpreted by 30. This may be implemented in a number of ways, such as by using an entirely different CRC process or by simply using the standard ISDN CRC process and processing it mathematically (for example, add 1 to the result of an ISDN CRC or do a binary inversion) to assure that a different CRC is always generated. It is noted that simple mathematical or logical manipulations of the ISDN CRC may decrease the error protection of that CRC process. Accordingly, it is desirable to use an alternate CRC which provides a high level of error protection while assuring that the CRC is different than that of the standard ISDN CRC for all possible messages. In this manner, error checking can still be readily accomplished for local communication while the central office interprets the frame to be in error. In other embodiments, other simple errors that do not affect the integrity of the local data may be introduced. One other example is to use a SAPI which is otherwise undefined at the central office. The most important consideration is that whatever error mechanism is used creates an error which will not hinder local communication but will be understood as an error by the central office and discarded.

Figure 3:
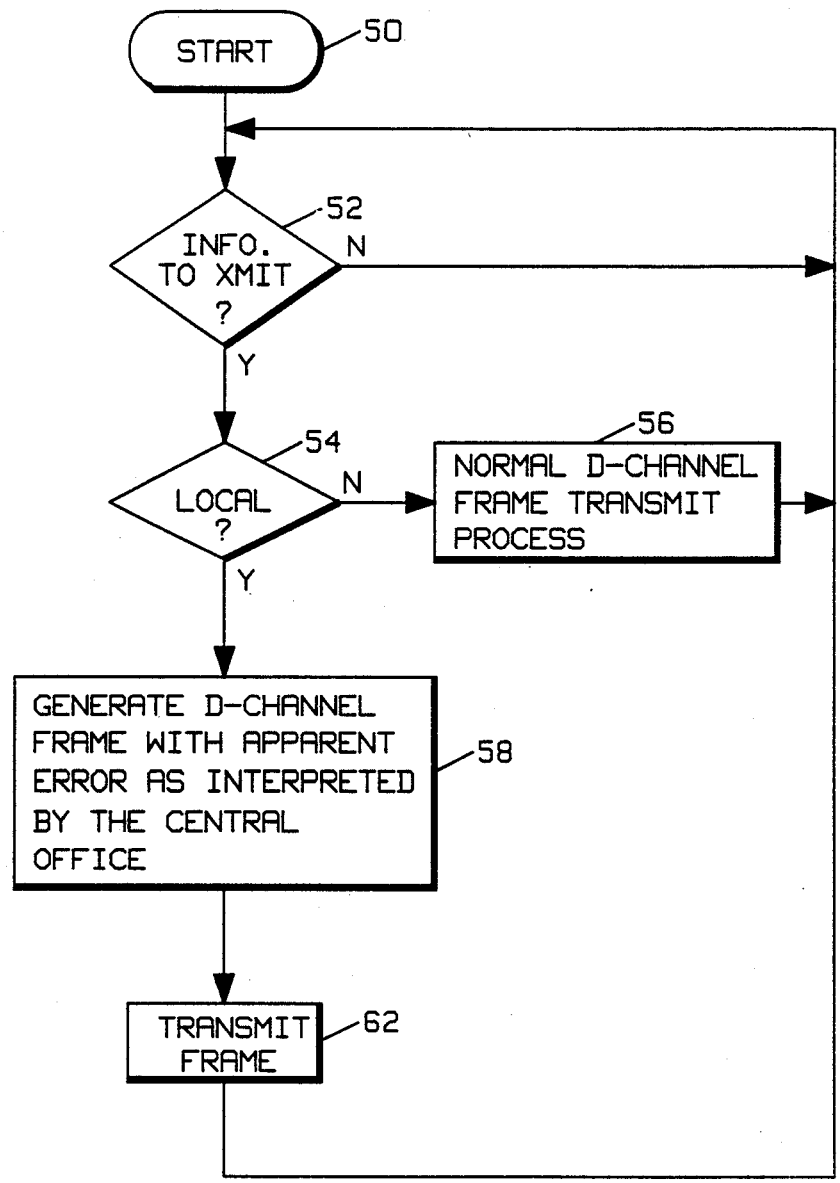
FIG. 3 is a flow chart of the operation of the present invention.

Turning now to FIG. 3, a flow chart shows the process of the present invention which starts at 50 after which 52 determines whether or not there is a D-channel frame to transmit. If not, the process waits until there is. When there is a frame to transmit, the process goes to 54 where it is determined whether or not it is local communication. If it is not, control passes to 56 where normal D-channel frame transmission occurs after which control passes back to 52. If so, control passes to 58 where a D-channel frame is generated with an apparent error (from the perspective of the central office). The frame is then transmitted at 62 after which control passes back to 52.

In light of the description of the transmit process, the receive process will be clear to those skilled in the art and involves detecting whether or not a D-echo channel frame has a local SAPI. If not, the process is the normal ISDN defined process. If so, the D-echo frame is processed using the alternate CRC (or other error detection) process.

Other embodiments will occur to those skilled in the art for implementation of the present invention. The invention may be implemented via using dedicated hardware, using some of the commercially available ISDN integrated circuits, using firmware or software driven microcomputers as well as combinations of the above without deviation from the present invention.

For example, the NT may include a mechanism for detecting frames with a local SAPI or frames using the alternate CRC and retransmit those frames over the D-channel for receipt by the destination TE so that modification of the TE to monitor the D-echo channel is unnecessary.

In other embodiments, it may be possible to achieve the same results by transmitting a D-channel frame which will be interpreted as a "no operation" by the central office; that is, the receipt of this frame by the central office would result in no specific action by the CO and no change in the network while providing a mechanism for transporting data between devices on the passive bus. For example, the frame may specify the length of the information field to be zero and the actual local information can be placed in a field of the frame which is ignored by the CO. This would also likely achieve the desired result of having the CO ignore or throw away the frame while effecting a local communication link. Other modifications will occur to those skilled in the art.

Thus it is apparent that in accordance with the present invention an apparatus that fully satisfies the objectives, aims and advantages is set forth above. While the invention has been described in conjunction with a specific embodiment, it is evident that many alternatives, modifications and variations will become apparent to those skilled in the art in light of the foregoing description. Accordingly, it is intended that the present invention embrace all such alternatives, modifications and variations as fall within the spirit and broad scope of the appended claims.

What is claimed is:

1. An apparatus for providing communication over a passive bus in an ISDN without use of services of a central office, said ISDN using a predefined error checking operation at said central office, the apparatus comprising in combination:
   echo receiving means, coupled to said passive bus, for receiving D-echo channel frames which are transmitted from a device connected to said passive bus and echoed by a network termination device; and
   alternate error checking means, coupled to said receiving means, for performing an alternate error checking operation on said D-echo channel frames, said alternate error checking operation being different from said predefined error checking operation used at said central office so that frames generated using said alternate error checking operation appear to contain an error when checked by said predefined error checking operation.

2. The apparatus of claim 1, wherein said error checking means comprises means for performing a CRC check.

3. The apparatus of claim 2, wherein said means for performing a CRC check comprises means for performing a CRC check which is a modification of a CRC check used in said predefined error checking operation.

4. The apparatus of claim 2, wherein said means for performing a CRC check comprises means for performing a CRC check which is a completely different process from said predefined error checking operation.

5. The apparatus of claim 1, further comprising:
   D-channel receiving means for receiving D-channel frames over said passive bus; and
   standard error checking means for performing said predefined error checking operation on said D-channel frames.

6. The apparatus of claim 1, further comprising processing means, coupled to said error checking means, for receiving said D-echo channel frames from said alternate error checking means and performing a higher layer process upon the frame.

7. A method for providing communication over a passive bus in an ISDN without use of services of a central office, said ISDN using a predefined error checking operation at said central office, the method comprising the steps of:
   receiving a D-echo channel frame which is transmitted from a device connected to said passive bus and echoed by a network termination device; and
   performing an error checking operation on said D-echo channel frame, said error checking operation being different from said predefined error checking operation used at said central office such that frames generated using said error checking operation would appear to contain an error if checked by said central office.

8. The method of claim 7, wherein said error checking operation comprises performing a CRC check.

9. The method of claim 8, wherein said step of performing a CRC check comprises the step of performing a CRC check which is a modification of said error checking operation.

10. The method of claim 8, wherein said step of performing a CRC check comprises the step of performing a CRC check which is a completely different process from said error checking operation.

11. The method of claim 7, further comprising the steps of:
   receiving a D-channel frame over said passive bus; and
   performing a CRC checking operation on said D-channel frame.

12. The method of claim 7, further comprising the steps of receiving said D-echo channel frame from said alternate error checking means and performing a higher layer process upon said frame.

13. An apparatus for providing communication between two devices coupled to a common passive bus of an ISDN without intervention by a central office, comprising in combination:
   determining means for determining that information is to be transmitted to a local device on said passive bus;
   apparent error generating means for generating a D-channel frame which, when checked by said central office, will apparently contain an error but in fact does not; and
   transmitting means for transmitting said D-channel frame over said passive bus.

14. The apparatus of claim 13, wherein said apparent error generating means comprises means for generating an alternate CRC which is different from a CRC expected by said central office.

15. The apparatus of claim 14, wherein said alternate CRC is derived by modifying said CRC expected by said central office.

16. The apparatus of claim 14, wherein said alternate CRC is derived using a CRC process distinct from said CRC expected by said central office.

17. A method for providing communication between two devices coupled to a common passive bus of an ISDN without intervention by a central office, comprising the steps of:

determining that information is to be transmitted to a local device on said passive bus;
generating a D-channel frame which apparently contains an error when viewed by said central office; and
transmitting said D-channel frame over said passive bus.

18. The method of claim 17, wherein said apparent error is created by generating an alternate CRC which is different from a CRC expected by said central office.

19. The method of claim 18, wherein said alternate CRC is derived by modifying said CRC expected by said central office.

20. The method of claim 18, wherein said alternate CRC is derived using a CRC process distinct from said CRC expected by said central office.

21. A method of transmitting messages over a passive bus from one TE device to another TE device without central office intervention, comprising the steps of:
determining that a frame of information is to be destined for a TE device situated on the same passive bus as a TE device which is to transmit; and
introducing an alteration to the frame of information in relation to what a standard ISDN frame of information would normally be so that the central office will interpret the frame as containing an error and discard the frame.

22. The method of claim 21, wherein the introducing step comprises generating a CRC which is not recognized by said central office.

23. The method of claim 22, further comprising the step of transmitting said frame over a D-channel of said passive bus.

24. The method of claim 21, further comprising the step of retransmitting said frame over a D-echo channel of said passive bus.

25. The method of claim 24, further comprising the steps of receiving said frame over said D-echo channel of said passive bus and performing an alternate CRC process on said frame, said alternate CRC process being different than a CRC process used by said central office.

26. A method for providing communication between two devices coupled to a common passive bus of an ISDN without intervention by a central office, comprising the steps of:
determining that information is to be transmitted to a local device on said passive bus;
generating a D-channel frame containing at least a portion of said information in a data field thereof, and a Service Access Point Identifier (SAPI) which is undefined in said central office and thus results in no operation by said central office; and
transmitting said D-channel frame over said passive bus.

* * * * *